(12) United States Patent
Popp et al.

(10) Patent No.: US 7,759,704 B2
(45) Date of Patent: Jul. 20, 2010

(54) MEMORY CELL ARRAY COMPRISING WIGGLED BIT LINES

(75) Inventors: Martin Popp, Dresden (DE); Till Schloesser, Dresden (DE)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 12/252,853

(22) Filed: Oct. 16, 2008

(65) Prior Publication Data

US 2010/0096669 A1   Apr. 22, 2010

(51) Int. Cl.
*H01L 27/10* (2006.01)
(52) U.S. Cl. ............... 257/208; 257/390; 257/E27.084
(58) Field of Classification Search ............. 257/296, 257/390–392, 202, 208, E27.084–E27.086
See application file for complete search history.

(56) References Cited

U.S. PATENT DOCUMENTS

| | | | |
|---|---|---|---|
| 5,502,320 | A | 3/1996 | Yamada |
| 6,035,355 | A | 3/2000 | Kelley et al. |
| 6,191,975 | B1 | 2/2001 | Shimizu et al. |
| 6,274,453 | B1 | 8/2001 | Schlosser et al. |
| 6,410,948 | B1 | 6/2002 | Tran et al. |
| 6,419,948 | B2 | 7/2002 | Blume et al. |
| 6,545,904 | B2 | 4/2003 | Tran |
| 6,635,918 | B1 | 10/2003 | Narui et al. |
| 6,735,132 | B2 | 5/2004 | Siek |
| 6,785,157 | B2 | 8/2004 | Arimoto et al. |
| 6,867,994 | B2 | 3/2005 | Tsukikawa |
| 6,894,915 | B2 | 5/2005 | Tran |
| 7,020,039 | B2 | 3/2006 | Tran et al. |
| 7,035,128 | B2 | 4/2006 | Yamasaki et al. |
| 7,045,834 | B2 * | 5/2006 | Tran et al. .................... 257/208 |
| 2004/0173838 | A1 | 9/2004 | Ichise et al. |
| 2004/0184298 | A1 | 9/2004 | Takahashi et al. |
| 2008/0073708 | A1 * | 3/2008 | Aiso .......................... 257/334 |

FOREIGN PATENT DOCUMENTS

| | | |
|---|---|---|
| KR | 1019950003402 B1 | 4/1995 |
| TW | 200425154 | 11/2004 |
| WO | 0101489 | 1/2001 |

* cited by examiner

*Primary Examiner*—Minh-Loan T Tran
*Assistant Examiner*—W. Wendy Kuo
(74) *Attorney, Agent, or Firm*—Edell, Shapiro & Finnan, LLC

(57) ABSTRACT

An integrated circuit including a memory cell array comprises transistors being arranged along parallel active area lines, bitlines, the bitlines being arranged so that an individual one intersects a plurality of the active area lines to form bitline-contacts, respectively, the bitlines being formed as wiggled lines, wordlines being arranged so that an individual one of the wordlines intersects a plurality of the active area lines, and an individual one of the wordlines intersects a plurality of the bitlines, wherein neighboring bitline-contacts, each of which is connected to one of the active area lines, are connected with different bitlines.

18 Claims, 6 Drawing Sheets

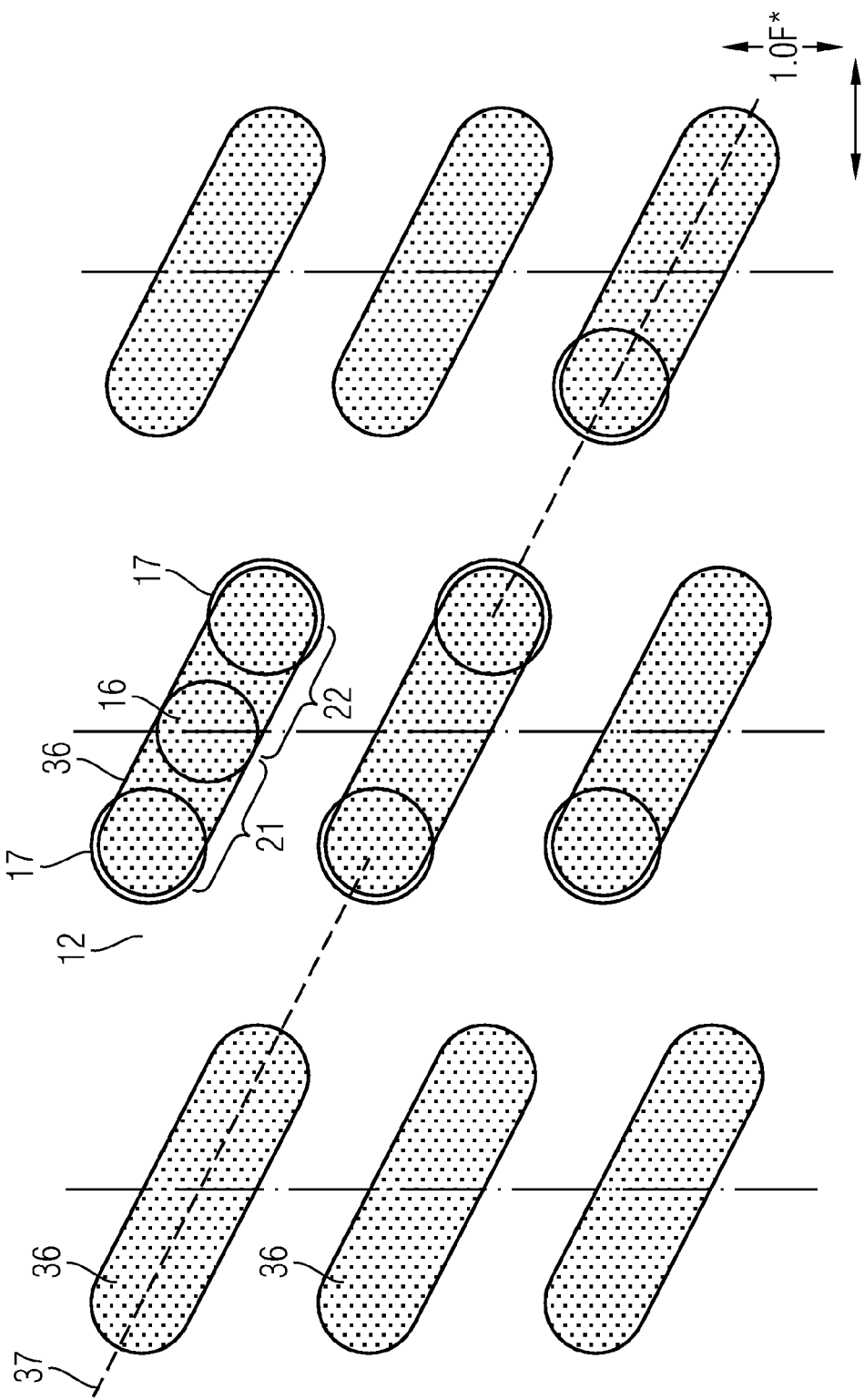

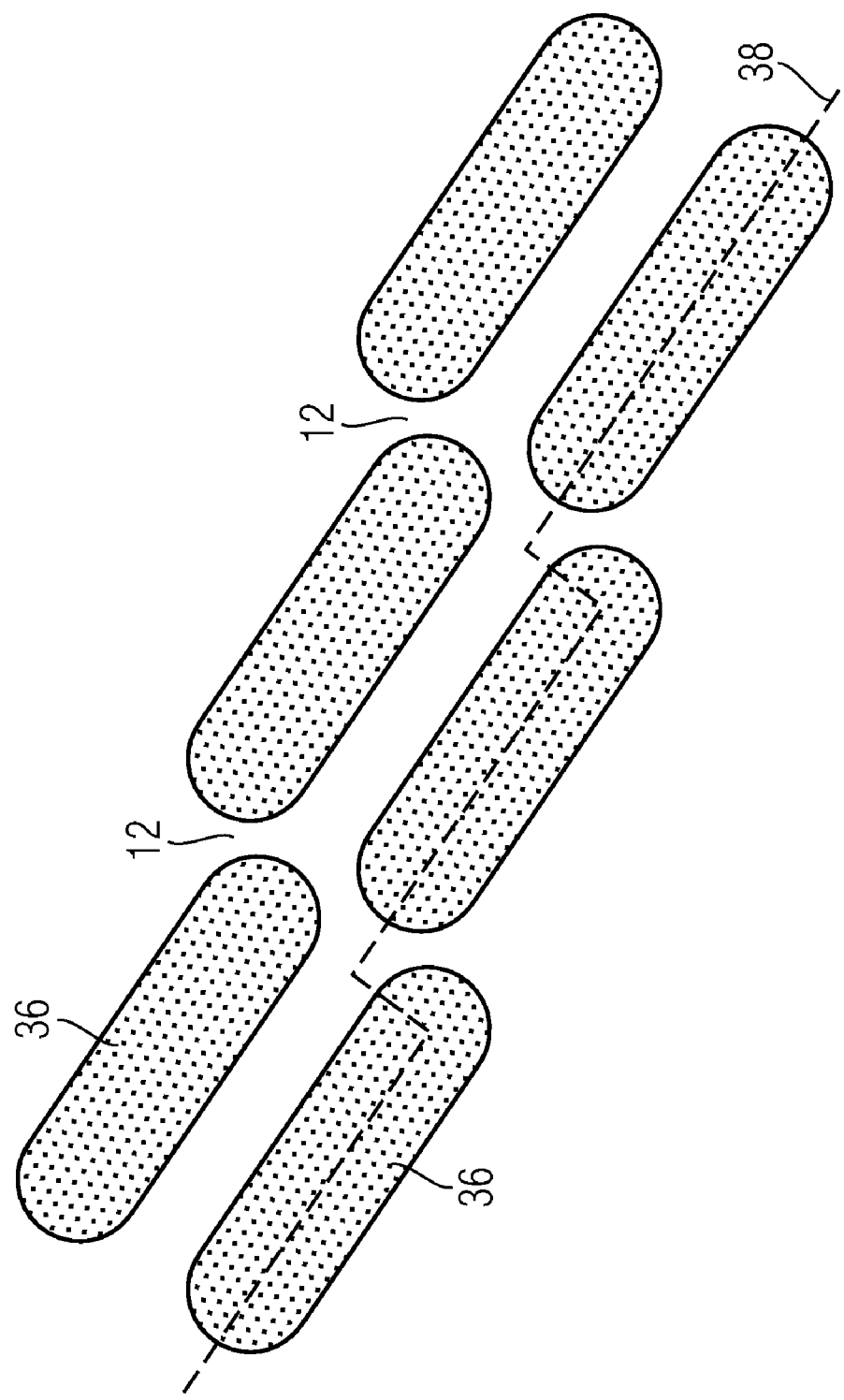

MEMORY CELL ARRAY COMPRISING WIGGLED BIT LINES

FIELD OF THE INVENTION

The present specification relates to an integrated circuit including a memory cell array, the memory cell array comprising wiggled bit lines.

BACKGROUND

Memory cell arrays generally comprise active areas in which components of the memory cells are disposed. For example, the access transistor of a DRAM (dynamic random access memory) cell may be disposed in such an active area. Adjacent active areas may be separated from each other by isolation trenches that may be filled with an insulating material. A memory cell array further comprises word lines for controlling a read or a write operation as well as bit lines for transmitting information that is stored in the individual memory cells.

Usually, the bit lines and the word lines are arranged so as to intersect each other. In conventional approaches, the active areas have been implemented so as to be parallel to the bit lines or to the word lines. Alternatively, the active areas may be formed so as to run in a direction that is slanted with respect to the direction of the bit lines and the word lines, respectively.

In general, there is a need for further improving memory cell arrays.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIGS. 2A and 2B, respectively, show implementations of active areas according to embodiments;

DETAILED DESCRIPTION

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. Is to be understood that other embodiments may be utilized and structural or logical changes may be made without departing from the scope defined by the claims.

Figure 1:
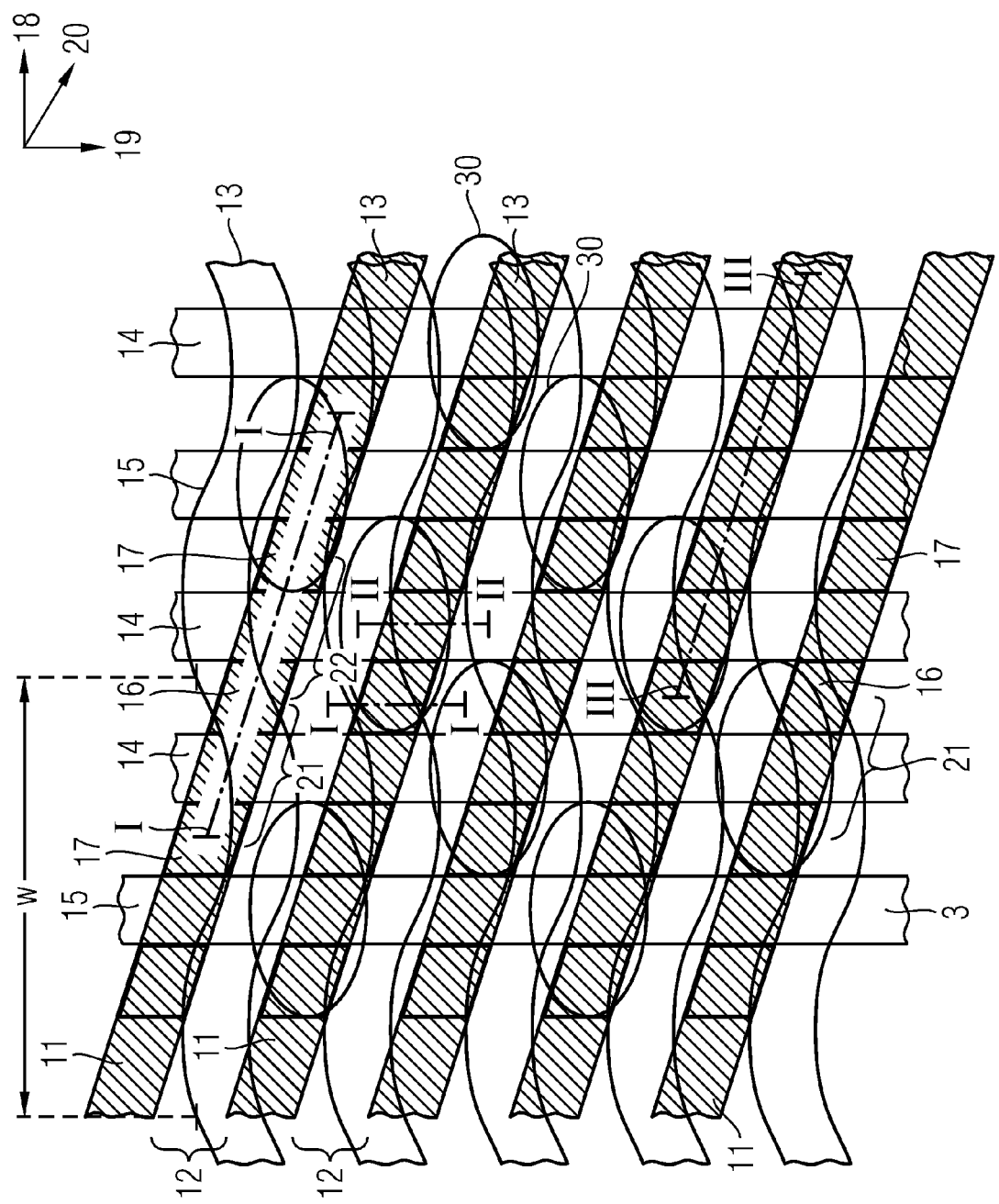
FIG. 1 shows a plan view of a memory cell array according to an embodiment.

FIG. 1 shows a plan view of an integrated circuit including a memory cell array.

The memory cell array comprises transistors that are arranged along parallel active area lines 11. The memory cell array further comprises bit lines 13 that are arranged so that an individual one of the bit lines 13 intersects a plurality of the active lines 11. At a point of an intersection of a bit line and an active area line a bit line contact 16 is formed. The bit lines 13 are formed as wiggled lines. The memory cell array further comprises word lines 14 that are arranged so that an individual one of the word lines 14 intersects a plurality of the active area lines 11. Moreover, an individual one of the word lines 14 intersects a plurality of the bit lines 13. Neighboring bit line contacts 16 that are connected to one of the active area lines 11 are connected with different bit lines 13. The bit lines 13 may undulate so as to have a fixed wiggling period. For example, the wiggling period may be measured with respect to points of intersection between the bit lines 13 and a line extending in a first direction 18. The wiggling period may correspond to the length of a memory cell 43, the length being measured along the first direction 18. Alternatively, the wiggling period may correspond to an integer multiple of the length of a memory cell 43. Accordingly, the bit lines 13 are not formed as straight lines but the may comprise curved or angled portions. The bit lines 13 may extend so as to meander around a straight line.

Generally, the bit lines 13 extend along the first direction 18. Accordingly, although they are not formed as straight lines, a line connecting a first and a second reference point, extends along a first direction 18. For example, the first and second reference points may be spaced apart from each other by a wiggling period of the bitlines or an integer multiple thereof. Moreover, the word lines 14 may extend along a second direction 19 that is approximately perpendicular to the first direction 18. The memory cell array shown in FIG. 1 further comprises isolation gate lines 15 that are arranged so that every third conductive line extending in the second direction 19 is an isolation gate line 15, the other lines being word lines. Accordingly, the isolation gate lines 15 extend parallel to the word lines 14. The isolation gate lines may be used for isolating groups of transistors belonging to one active area line 11 from each other. The active areas may be formed as lines 11. Adjacent active area lines 11 may be insulated from each other by isolation trenches 12 that are filled with an insulating material. The active area lines may be implemented as continuous active area lines, wherein adjacent transistors may be isolated from each other by means of an isolation transistor comprising an isolation gate that is operated in an off-state so as to turn off a current between adjacent transistors. Alternatively, neighboring transistors may be isolated from each other by means of an isolation groove or isolation trench that is filled with an insulating material.

In the embodiment shown in FIG. 1, two transistors 21, 22 comprise one common bit line contact 16 that is connected to a corresponding bit line 13. In the layout shown in FIG. 1, the bit line contacts 16 that are connected with different active area lines 11 are disposed along lines that extend in the second direction 19. Moreover, the capacitor contacts 17, that are connected with different active area lines 11 are as well disposed along lines that extend in the second direction 19. Accordingly, the bit line contacts as well as the capacitor contacts may be formed using a lithographic method using a mask having a lines/spaces pattern.

According to another understanding an integrated circuit including a memory cell array comprises bit lines 13 that are formed as wiggled lines. The memory cell array further comprises word lines running along a second direction 19 and active areas 11. Transistors 21, 22 are formed in the active areas and the active areas extend in a direction 20 that is slanted with respect to the first and second directions. The bit lines generally extend along a first direction 18. Bit lines 16 are disposed in a region that is generally defined by an intersection of a bit line 13 and a corresponding active area 11. Neighboring bit line contacts 16 that are shifted along a direction that is slanted with respect to first and second directions 18, 19, respectively, are connected with neighboring bit lines 13.

The active area lines 11 may extend in a third direction 20 that is slanted with respect to the first and the second directions 18, 19. Moreover, capacitor contacts 17 may be disposed between an isolation gate line 15 and a word line 14. The capacitor contact 17 may be configured to connect a transistor 21, 22 with a corresponding storage element such as a storage capacitor.

The memory cells of the memory cell array may be implemented as arbitrary memory cells. Examples include DRAM memory cells comprising a storage capacitor and an access transistor, phase changing memory cells (PCRAM), MRAM ("Magnetic Random Access Memories"), FERAM ("Ferroelectric Random Access Memories"), ZRAM ("Zero Capacitor Random Access Memories"), in which information is stored in a floating body transistor, and others. The bit lines 13 as well as the active area lines 11 are arranged in such a manner, that the general directions of the bit lines 13 and active area lines 11 differ from each other. Accordingly, there is only one point of intersection of a bit line 13 and a corresponding active area line 11. Accordingly, every active area line 11 is connected with a plurality of different bit lines 13. Bit line contacts 16 are formed as a point of intersection of the active areas lines 11 and the bit lines 13. The bit line contacts may be formed as single contact portions, for example, contact plugs, in case there is a distance between the active area lines 13 and the bit lines. Alternatively, the bit lines may be in direct contact with the active areas so that no additional contact plug is formed. In this case, the region of intersection refers to the bit line contact.

If the bit lines 13 are implemented as wiggled bit lines, a contact area of the bit line 13 and the active area 11 is increased whereby a contact resistance of the transistors to the corresponding bit lines is reduced. Moreover, a contact area of the active area 11 and the capacitor contact 17 is increased whereby a contact resistance of the transistors to the corresponding storage capacitors 30 is reduced. The bit lines 13 may be arranged at a predefined pitch, the pitch corresponding to the sum of the width of the bit lines and the space or distance therebetween. Moreover, the word lines 14 may as well be arranged at a predefined pitch. According to an embodiment, the pitch of the word lines may be equal to the pitch of the bit lines 13. According to another embodiment, the pitches may be different from each other. The width of the bitlines 13 may be equal to the space or distance therebetween. The width of the wordlines 14 may be equal to the space or distance therebetween.

The active areas may be formed as straight or angled lines 11. Moreover, the active need not necessarily be formed as lines but they may also be formed as segmented active areas. FIG. 2A shows an embodiment of the invention in which active area segments 36 are arranged along a straight line 37. Accordingly, neighboring active area segments 36 are insulated from each by isolation trenches 12 that are filled with an insulating material. The straight line 37 is formed so as to extend a long the third direction 20. As is shown in FIG. 2A, in each of the active area segments 36, two capacitor contacts 17 as well as one bit line contact 16 is disposed. Moreover, two transistors 21, 22 are arranged in each of the active area segments. Nevertheless, the active area segments 36 may as well be implemented in such a manner that a different number of transistors is arranged in each of the active area segments 36. Moreover, as is shown in FIG. 2B, the active area segments may be arranged along angled lines 38. Accordingly, the active are segments are disposed in a staggered manner.

Figure 3:
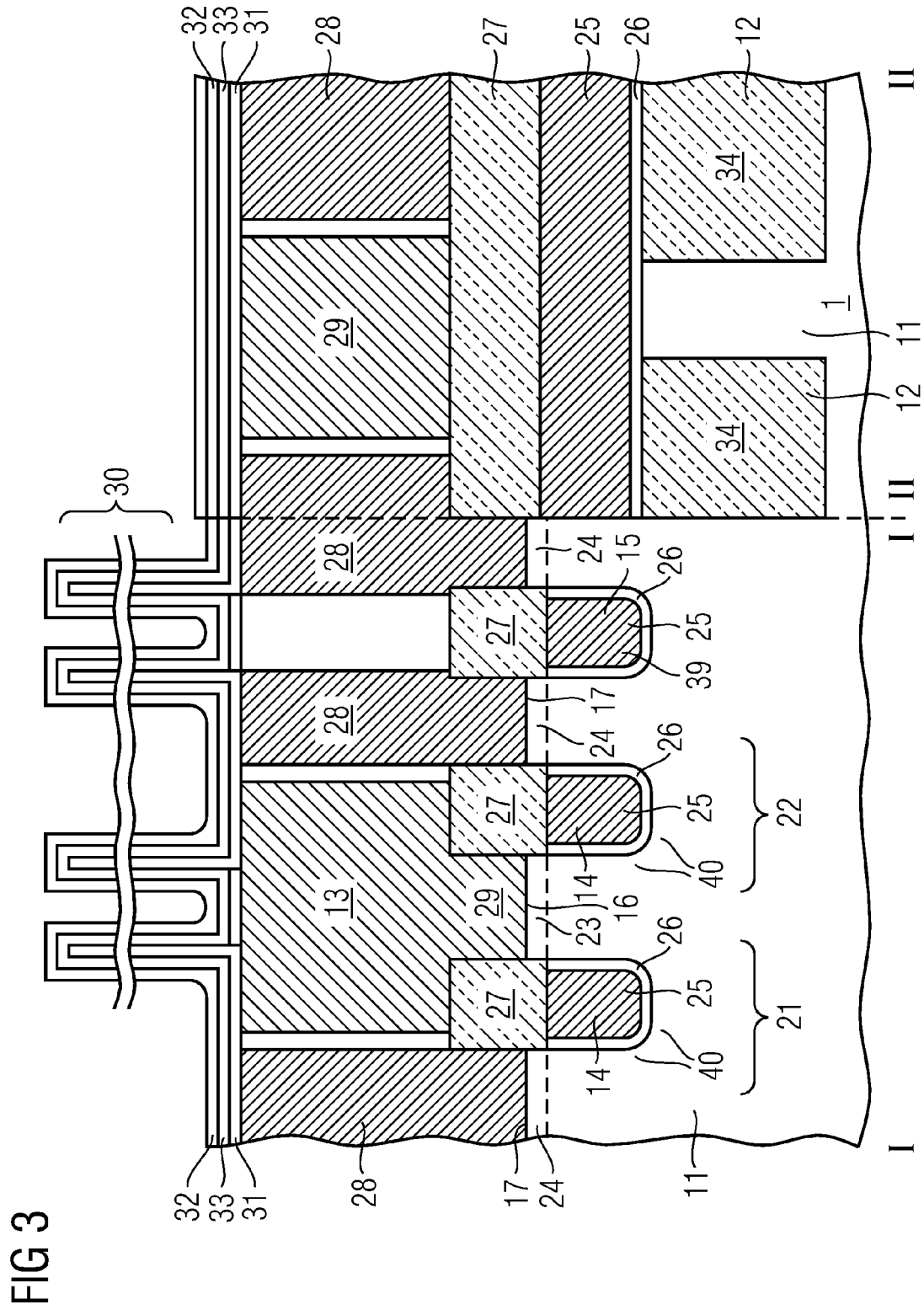
FIG. 3 shows a cross-sectional view of a memory cell according to an embodiment.

FIG. 3 shows a cross-sectional view of a memory cell forming part of the memory cell array shown in FIG. 1 according to an embodiment. The left hand side of FIG. 3 is a cross-sectional view taken between I and I, whereas the right hand part of the cross-sectional view is taken between II and II as is shown in FIG. 1, for example. In a substrate isolation trenches 12 as well as active areas 11 are formed. The terms "wafer", "substrate", "semiconductor chip" or "semiconductor substrate" used in the context of the present description may include any semiconductor-based structure that has a semiconductor substrate. Wafer and substrate are to be understood to include silicon, silicon-on-insulator (SOI), silicon-on-sapphire (SOS), doped and undoped semiconductors, epitaxial layers of silicon supported by a base crystalline material, and other semiconductor structures. The semiconductor need not be silicon-based. The semiconductor could as well be, among others, silicon-germanium, germanium or gallium arsenide. Various components may already be formed in the substrate. Moreover, different layers may be embedded in the substrate material. The isolation trenches 12 may be filled with an arbitrary insulating material such as silicon oxide, silicon nitride and others as well as combinations thereof. The active areas may be segmented into active area segments in an early process step. Alternatively, the active areas 11 may be formed as continuous lines, neighboring transistors being isolated from each other by an isolation device 39.

Transistors 21, 22 are disposed in the active areas 11. Each of the transistors comprises a first source/drain portion 23 and a second source/drain portion 24. A channel region 40 is disposed between the first and the second source/drain portions 23, 24. The conductivity of the channel region 40 may be controlled by the gate electrode 25. The gate electrode 25 is disposed between the first and the second source/drain portions 23, 24. The gate electrode 25 is insulated from the channel region 40 by a gate dielectric 24. The gate dielectric may comprise any of the generally known insulating materials such as silicon oxide, silicon nitride or further dielectric materials such as high-k dielectrics and others. A gate electrode 25 may form part of a corresponding word line 14. The material of the gate electrode 25 may be arbitrary. For example, polysilicon or any suitable conductive material may be used. Examples comprise metals such as tungsten and combinations of conductive layers. The word line may be made of a material that comprises the same materials as the gate electrode 25. Moreover, the word line may be made of a material that is different from the material of the gate electrode 25. The word line 14 may be disposed so that an upper surface thereof is disposed beneath or approximately at the same height as the main surface of the semiconductor substrate 1. The word lines 14 may be arranged so that they extend in the active areas 11 to approximately the same depth as in the isolation trenches 12. An insulating cap layer 27 may be disposed above the buried word line 14 or the gate electrode 25, respectively. The first and second source/drain portions may be implemented as doped portions. In FIG. 3, two adjacent transistors 21, 22 share one common bit line contact 16.

In the embodiment shown in FIG. 3, the bit line 13 is directly adjacent to a main surface of the substrate so that the interface between semiconductor material and the conductive material 29 of the bit line 13 forms the bit line contact 16. The conductive material 29 of the bit line may be selected in an arbitrary manner. For example, the material of the bit line 13 may correspond or may be identical with the material of a gate electrode of a transistor in the peripheral portion (not shown). For example, the conductive material of the bit line 13 may comprise polysilicon. Moreover, the conductive material 29 may comprise further conductive materials, for example, a metal. As still a further example, the bit line 13 may comprise a metal only. The bit line 13 is arranged in the manner as has been explained above.

A capacitor contact 17 is arranged so as to be adjacent to second source/drain portion 24. Moreover, a conductive plug 28, for example, a polysilicon plug may be disposed so as to be in contact with the second source/drain portion 24. Moreover, a capacitor 30 is in contact with the conductive plug 28. The capacitor may be disposed above the main surface of the substrate 1. The capacitor 30 may comprise a first capacitor electrode 31, a second capacitor electrode 32 as well as a suitable capacitor dielectric 33. The materials of the capacitor electrodes 31, 32 and of the dielectric material 33 may be selected in accordance with the technological requirements. For example, the first and the second capacitor electrodes 31, 32 may comprise a metal or any other suitable conductive material. Moreover, the dielectric material 33 may be a so-called high-k dielectric. High-k materials may be defined as having a dielectric constant which is greater than the dielectric constant of silicon dioxide. Examples for high-k-materials include transition metal oxides, zirconium, hafnium-oxide, lead zirconium titanate, tantalum oxide, silicon nitride, and/or barium strontium titanate. Further examples include combinations or mixtures of any of these materials. The right hand side of FIG. 3 shows a cross-sectional view between II and II intersecting an active area 11 and parallel to a word line 14.

As is further shown in the left hand portion between I and I, there is an isolation device 39 that isolates a further transistor (not shown in this cross-sectional view) from transistor 22. The isolation device 39 may comprise a recess structure in the substrate that is filled with an insulating material. Alternatively, as is shown in FIG. 3, the recess structure may be formed so as to form a gate electrode 25 that is operated in an off-state so as to minimize a current flow between the doped portions 24. In the device 39, the gate electrode 25 may be insulated from the substrate material 1 by a suitable gate dielectric 26. Moreover, the gate electrode 25 of the isolation device 39 may form part of an isolation gate line 15 that may extend parallel to the word lines 14. Accordingly, isolation gate line 15 and word line 14 may be identical in construction. Likewise, the gate electrode of an access transistor and the gate electrode of the isolation device 39 may be identical in construction. Nevertheless, the isolation gate line 15 and word line 14 are held on different potentials, respectively.

Figure 4:
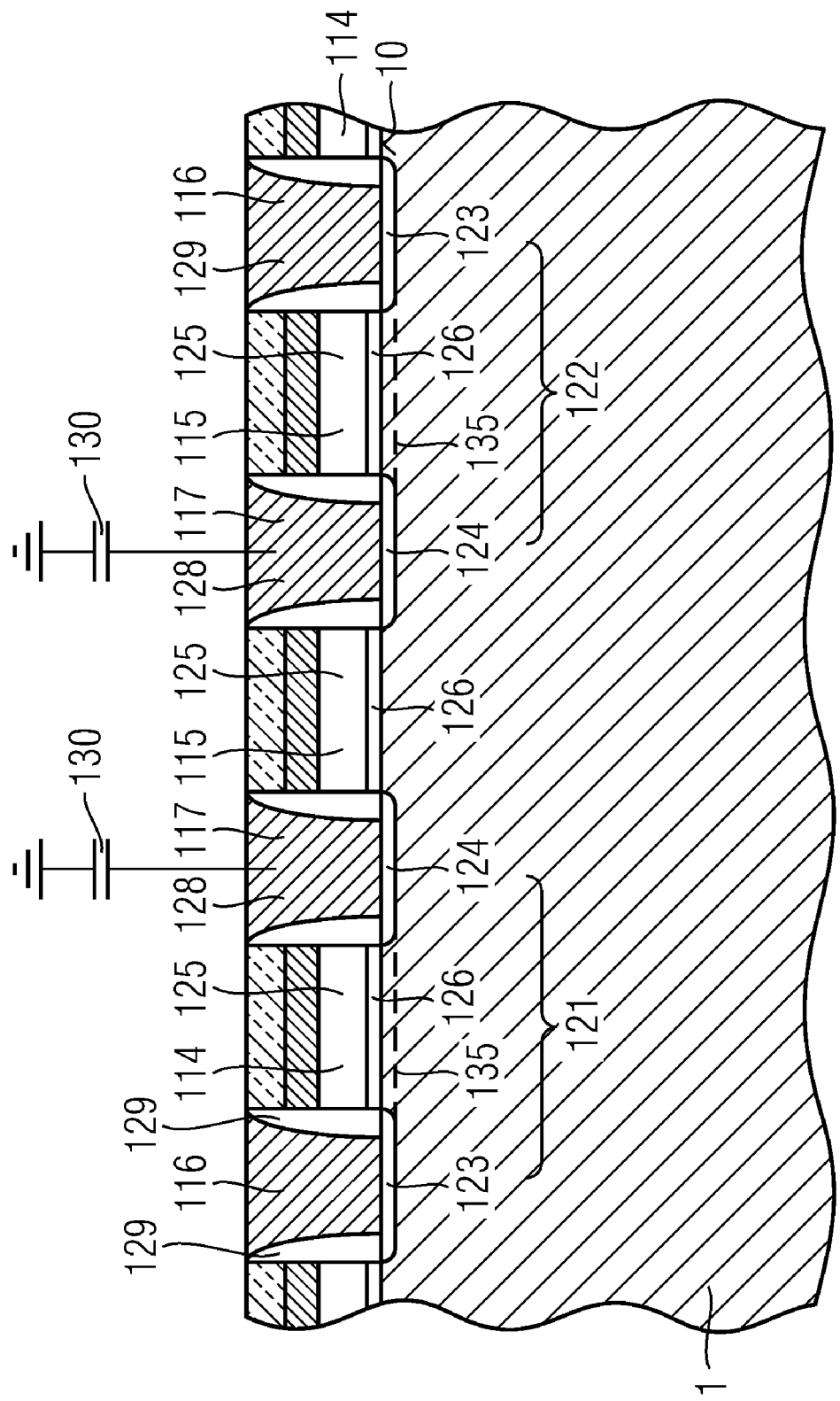
FIG. 4 shows another cross-sectional view of an embodiment.

FIG. 4 shows a cross-sectional view of a further memory cell which may form part of the memory cell array shown in FIG. 1 according to an embodiment. First and second access transistors 121, 122 are formed in a semiconductor substrate 1. The first access transistor 121 may comprise a first and a second source/drain region 123, 124. The first and the second source/drain portion 123, 124 may be implemented as n-doped portions. The channel region 135 may be formed in the p-doped substrate portion between the first and the second source/drain portion 123, 124. The conductivity of the channel 135 may be controlled by the gate electrode 125. The gate electrode 125 is insulated from the channel region 135 by the gate dielectric 126. The material of the gate electrode 125 may comprise any of the materials that are used as gate conductive materials such as polysilicon, tungsten and other metals. The gate electrode 125 may form part of a corresponding word line 114. As is shown in FIG. 4, the gate electrode 125 may comprise several conductive layers. The first source/drain portion 123 may be connected via a bit line contact 116 with a corresponding bit line (not shown). Moreover, the second source/drain portion 124 may be connected via a capacitor contact 117 with a corresponding storage capacitor 130.

Nevertheless, as is clearly to be understood, the memory cell is not restricted to a DRAM memory cell and other types of memory cells may as used as well as has been explained above. As is shown in FIG. 4, the conductive material of the gate electrode 125 is disposed above the substrate surface 10. To be more specific the gate electrode 125 may be completely disposed above the substrate surface so that, as is shown in FIG. 4, a planar channel that extends along a horizontal surface of the substrate may be formed. The memory cell array shown in FIG. 4 also comprises an isolation device 139 comprising a gate electrode that may form part of a corresponding isolation gate line as has been explained above.

Figure 5:
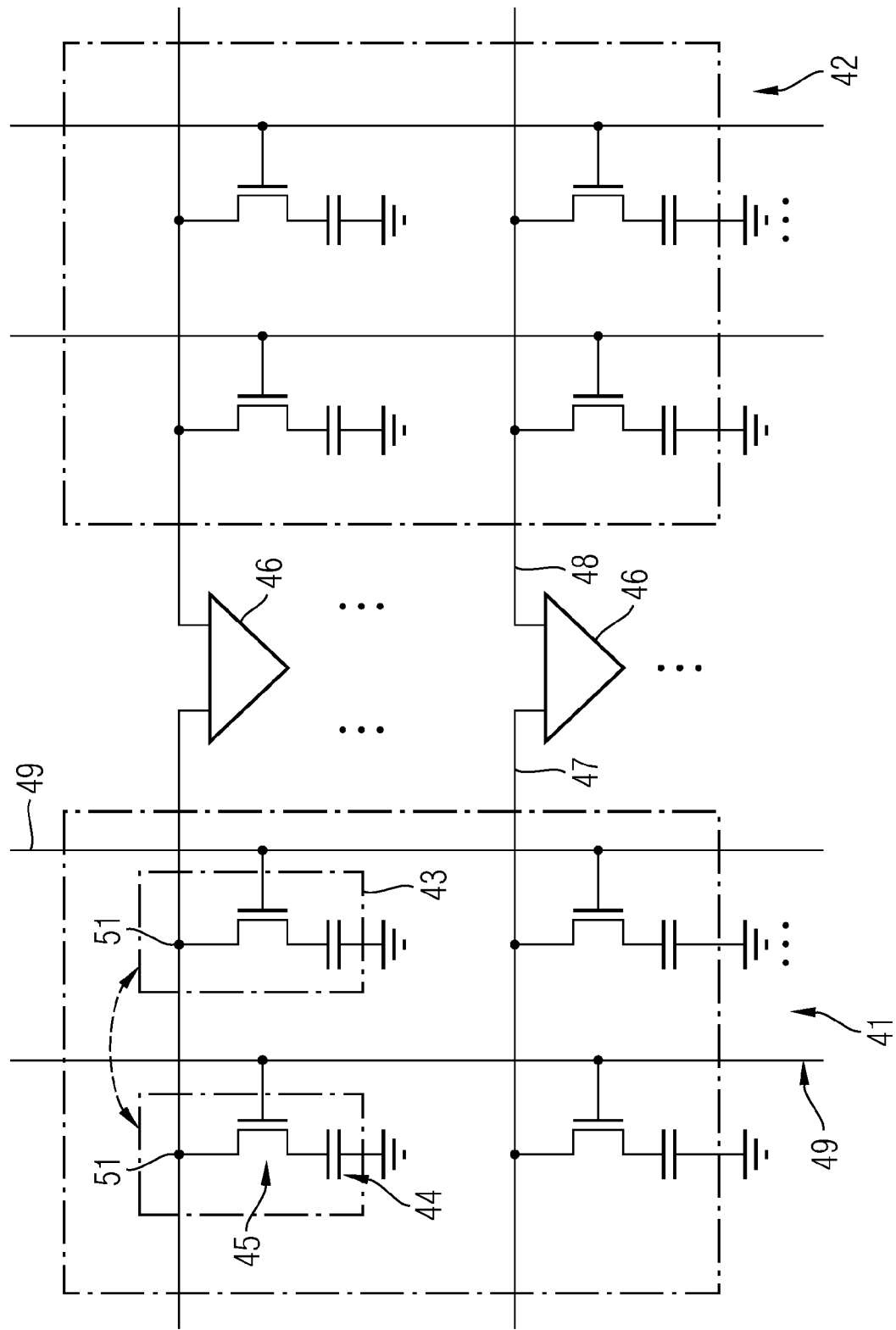
FIG. 5 shows an equivalent circuit diagram of a memory cell array that is, for example, shown in FIG. 1.

FIG. 5 represents an equivalent circuit diagram of a pair of a first and second memory cell arrays 41, 42 in order to illustrate an operation scheme of the memory cell array shown above. The arrays 41, 42 may be implemented in an open bit line configuration. Each of the memory cell arrays comprises memory cells 43. The memory cells 43 comprise a transistor 45 and a storage capacitor 44, respectively.

The first and second memory cell arrays 41, 42 are each coupled to respective groups of first and second bit lines 47, 48. The two groups of bit lines 47, 48 are coupled one from each of the memory cell arrays 41, 42 to sense amplifiers 46. The sense amplifier 46 may comprise peripheral circuitry. For example, this circuitry may comprise devices employed in support of memory cell arrays 41, 42 and generally formed outside the memory cell arrays 41, 42.

In operation, one memory cell 43 is selected, for example, by activating one word line 49. The word line 49 is coupled to a respective gate electrode of a respective one of the transistors 45. The bit line 47 is connected with the first source/drain region of one of these transistors 45 via the bit line contact 51. The transistor 45 is then turned on, transmitting charge stored in the capacitor 44 to the associated bit line 47. The sense amplifier 46 senses the charge coupled from the capacitor 44 to the bit line 47. The sense amplifier 46 compares this signal to a reference signal such as the reference charge Qref or a reference signal which is obtained by sensing a corresponding bit line 48, without a voltage being applied to the corresponding word line. Nevertheless, as is clearly to be understood, any alternative array architecture may be used as well.

The memory cell array comprising wiggled bitlines as has been explained above may be manufactured using commonly used semiconductor manufacturing methods. For example, the bitlines may be patterned using a photolithographic method using a mask. The mask may comprise a lines/spaces pattern having wiggled lines.

The embodiments of the invention described in the foregoing description are examples given by way of illustration and the invention is nowise limited thereto. Any modification, variation and equivalent arrangement should be considered as being included within the scope of the invention.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit including a memory cell array comprising:
    transistors arranged along parallel continuous active area lines;
    bitlines arranged such that individual ones of the bitlines intersect a plurality of the continuous active area lines to form bitline-contacts, respectively, the bitlines being formed as wiggled lines; and
    wordlines arranged so that individual ones of the wordlines intersect a plurality of the continuous active area lines, and individual ones of the wordlines intersect a plurality of the bitlines, wherein neighboring bitline-contacts, each of which is connected to a same continuous active area line, are connected with different bitlines;
    wherein the bitlines generally extend along a first direction;
    wherein the wordlines extend along a second direction, the second direction being perpendicular to the first direction; and
    wherein the continuous active area lines extend in a direction that is slanted with respect to the first and second directions.

2. The integrated circuit according to claim 1, wherein the active area lines are straight lines.

3. The integrated circuit according to claim 1, wherein the memory cell array further comprises storage capacitors.

4. The integrated circuit according to claim 3, wherein the storage capacitors are formed over a surface of a semiconductor substrate.

5. The integrated circuit according to claim 1, wherein one bitline-contact is associated with two neighboring transistors that are assigned to one active area line.

6. The integrated circuit of claim 1, wherein the bitline-contacts that are associated with neighboring bitlines are arranged along one line, this line generally extending along the second direction.

7. The integrated circuit of claim 1, further comprising capacitor contacts that are configured to connect the transistors with corresponding capacitors, wherein the capacitor contacts are disposed along lines extending in the second direction.

8. The integrated circuit according to claim 1, wherein the wordlines are formed as buried wordlines.

9. The integrated circuit of claim 1, further comprising isolation gatelines which are adapted to isolate neighboring transistors from each others, the isolation gatelines being arranged in parallel with the wordlines.

10. An integrated circuit including a memory cell array comprising:
    bitlines formed as wiggled lines, the bitlines generally extending along a first direction;
    wordlines running along a second direction, the second direction being perpendicular to the first direction;
    continuous active area lines, transistors being formed in the active area lines, the active area lines extending in a direction that is slanted with respect to the first and second directions; and
    bitline contacts disposed in regions generally defined by an intersection of a bitline and a corresponding continuous active area line;
    wherein neighboring bitline contacts that are shifted along a direction that is slanted with respect to the first and second directions, respectively, and that are disposed in regions corresponding to a same continuous active area line, are connected with neighboring bitlines.

11. The integrated circuit according to claim 10, wherein the active area lines are straight lines.

12. The integrated circuit according to claim 10, wherein the memory cell array further comprises storage capacitors.

13. The integrated circuit according to claim 12, wherein the storage capacitors are formed over a surface of a semiconductor substrate.

14. The integrated circuit according to claim 10, wherein one bitline contact is associated with two neighboring transistors that are assigned to one active area line.

15. The integrated circuit of claim 10, wherein the bitline-contacts that are associated with neighboring bitlines are arranged along one line, this line generally extending along the second direction.

16. The integrated circuit of claim 10, further comprising capacitor contacts that are configured to connect the transistors with corresponding capacitors, wherein the capacitor contacts are disposed along lines extending in the second direction.

17. The integrated circuit according to claim 10, wherein the wordlines are formed as buried wordlines.

18. The integrated circuit of claim 10, further comprising isolation gatelines which are adapted to isolate neighboring transistors from each others, the isolation gatelines being arranged in parallel with the wordlines.

* * * * *